United States Patent
Wei et al.

(10) Patent No.: US 7,442,998 B2
(45) Date of Patent: *Oct. 28, 2008

(54) NON-VOLATILE MEMORY DEVICE

(75) Inventors: Houng-Chi Wei, Hsinchu (TW); Saysamone Pittikoun, Hsinchu County (TW); Wei-Chung Tseng, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 373 days.

This patent is subject to a terminal disclaimer.

(21) Appl. No.: 11/162,648

(22) Filed: Sep. 18, 2005

(65) Prior Publication Data
US 2006/0234446 A1 Oct. 19, 2006

(30) Foreign Application Priority Data
Mar. 9, 2005 (TW) .............................. 94107083 A

(51) Int. Cl.
*H01L 29/78* (2006.01)
(52) U.S. Cl. .............................. 257/391; 257/E27.103
(58) Field of Classification Search ................. 257/391, 257/E27.103
See application file for complete search history.

(56) References Cited

U.S. PATENT DOCUMENTS 6,624,024 B1 * 9/2003 Prall et al. .................. 438/257
7,180,128 B2 * 2/2007 Hung et al. .................. 257/320

* cited by examiner

*Primary Examiner*—Chandra Chaudhari
(74) *Attorney, Agent, or Firm*—Jianq Chyun IP Office

(57) ABSTRACT

A method of fabricating a non-volatile memory is provided. A memory cell array having first memory units and second memory units is formed on a substrate. Then, a source region and a drain region are formed in the substrate on the respective sides of the memory cell array. Next, a patterned first inter-layer insulating layer is formed on the substrate to form a first trench and a plurality of second trenches. A conductive layer is formed on the substrate to form a source line in the first trench and conductive lines in the second trenches. A second inter-layer insulating layer is formed on the substrate and then a conductive plug having contact with the drain region is formed in the second inter-layer insulating layer and the first inter-layer insulating layer. Then, a bit line having contact with the conductive plug is formed on the second inter-layer insulating layer.

8 Claims, 11 Drawing Sheets

NON-VOLATILE MEMORY DEVICE

CROSS-REFERENCE TO RELATED APPLICATION

This application claims the priority benefit of Taiwan application serial no. 94107083, filed on Mar. 9, 2005. All disclosure of the Taiwan application is incorporated herein by reference.

BACKGROUND OF THE INVENTION

1. Field of the Invention

The present invention relates to a semiconductor memory device. More particularly, the present invention relates to a non-volatile memory and fabricating method thereof.

2. Description of the Related Art

Among various types of non-volatile memory products, electrically erasable programmable read only memory (EEPROM) is a memory device that has been widely used in personal computers and electronic equipment. Data can be stored, read out or erased from the EEPROM many times and stored data are retained even after power supplying the devices is cut off.

Typically, the floating gate and the control gate of an EEPROM cell are fabricated using doped polysilicon. In the conventional technique, a charge-trapping layer is sometimes used to replace polysilicon fabricated floating gate. The material of the charge-trapping layer is silicon nitride, for example. In general, an oxide layer is formed both above and below the silicon nitride charge-trapping layer to form an oxide/nitride/oxide (ONO) composite layer. This type of memory is often referred to as a silicon-oxide-nitride-oxide-silicon (SONOS) memory device.

FIG. 1 is a schematic cross-sectional view of a conventional non-volatile memory developed in recent years. As shown in FIG. 1, the non-volatile memory has a memory cell array 117 including a plurality of memory cells 102 and a plurality of memory cells 116. The memory cells 102 and the memory cells 116 are isolated from one another through insulating spacers 110. Each memory cell 102 includes a bottom dielectric layer 104a, a charge-trapping layer 104b, a top dielectric layer 104c (the bottom dielectric layer 104a, the charge-trapping layer 104b and the top dielectric layer 104c together form a composite layer 104), a gate 106 and a mask layer 108 sequentially formed over the substrate 100. The memory cells 116 are disposed between every pair of adjacent memory cells 102. Each memory cell 116 includes a bottom dielectric layer 112a, a charge-trapping layer 112b, a top dielectric layer 112c (the bottom dielectric layer 112a, the charge-trapping layer 112b and the top dielectric layer 112c together form a composite layer 112) and a gate 114 sequentially formed over the substrate 100. Because there is no gap between various memory cells in the non-volatile memory, overall level of integration of the device can be increased.

However, the gates of the memory cells 102 are typically fabricated from polycide material, for example, formed by a doped polysilicon layer 106a and a silicide layer 106b. Because the gate 114 of the memory cell 116 is formed on a non-planar surface, it is difficult to fill a low resistant conductive material such as tungsten silicide inside it. Therefore, the gate 114 can only be formed using a higher resistant material such as doped polysilicon. Since doped polysilicon has a higher resistance, the operating speed of the device is limited that it is difficult to use the device in a high-speed environment.

Furthermore, there is difference in resistance between the material constituting the gate 106 of the memory cell 102 and that constituting the gate 114 of the memory cell 116. That is, the memory cell 116 has a resistance significantly higher than that of the memory cell 102. As a result, the electrical properties between the two memory cells are different and may lead to a drop in device performance and stability.

SUMMARY OF THE INVENTION

Accordingly, at least one objective of the present invention is to provide a method of fabricating a non-volatile memory that can reduce the gate resistance, improve the electrical performance of the memory cell and increase the efficiency and stability of the device.

At least a second objective of the present invention is to provide a non-volatile memory capable of resolving the problem of a high resistance in doped polysilicon gates and the problem of electrical incompatibility between memory cells.

To achieve these and other advantages and in accordance with the purpose of the invention, as embodied and broadly described herein, the invention provides a method of fabricating a non-volatile memory. First, a substrate is provided. Then, a plurality of first memory units is formed on the substrate. The first memory units are separated from one another by a gap. Each first memory unit includes a first composite layer, a first gate and a cap layer sequentially formed over the substrate. Then, a plurality of insulating spacers is formed on the sidewalls of the first memory units. A plurality of second memory units is formed in the gap between various first memory units. The second memory units together with the first memory units form a memory cell array. Each second memory unit includes a second composite layer and a second gate sequentially formed over the substrate. After that, a source region and a drain region are formed in the substrate on the respective sides of the memory cell array. A first inter-layer insulating layer is formed over the substrate and then the first inter-layer insulating layer is patterned to form a first trench and a plurality of second trenches. The first trench exposes the source region and the second trenches expose the second gates of the second memory units in the same column. A conductive layer is formed over the substrate. The conductive layer completely fills the first trench and the second trenches. Then, a portion of the conductive layer is removed until the first inter-layer insulating layer is exposed so that a source line is formed within the first trench and a plurality of conductive lines is formed within the second trenches. Thereafter, a second inter-layer insulating layer is formed over the substrate and then a conductive plug having a contact with the drain region is formed in the second inter-layer insulating layer and the first inter-layer insulating layer. Lastly, a bit line having contact with the conductive plug is formed over the second inter-layer insulating layer.

According the method of fabricating the non-volatile memory in the preferred embodiment of the present invention, the first gate can be fabricated from a polycide material, the second gate can be fabricated from doped polysilicon and the source line and the conductive lines can be fabricated from tungsten, for example.

According the method of fabricating the non-volatile memory in the preferred embodiment of the present invention, the method of removing a portion of the first conductive layer until the first inter-layer insulating layer is exposed includes performing a chemical-mechanical polishing operation.

According the method of fabricating the non-volatile memory in the preferred embodiment of the present invention, the first composite layer and the second composite layer can be an oxide/nitride/oxide composite layer.

In the aforementioned method of fabricating the non-volatile memory, the process of patterning the first inter-layer insulating layer may include the fabrication of the first trench and the second trenches. Thereafter, the source line and the plurality of conductive lines for connecting with the second gates can also be fabricated in the same step. Thus, without increasing the number of processing steps, the electrical resistance of the second gates is reduced and the conductivity of the second gates is increased. Ultimately, the electrical performance of the second memory units is improved.

The present invention also provides another method of fabricating a non-volatile memory. First, a plurality of first memory units is formed on a substrate. The first memory units are separated from one another by a gap. Each first memory unit includes a first composite layer, a first gate and a cap layer sequentially formed over the substrate. Then, a plurality of insulating spacers is formed on the sidewalls of the first memory units and then a plurality of second memory units is formed in the gaps between the first memory units. The second memory units together with the first memory units form a memory cell array. Each second memory unit includes a second composite layer and a second gate sequentially formed over the substrate. Then, a source region and a drain region are formed in the substrate on the respective sides of the memory cell array. A first inter-layer insulating layer is formed over the substrate and then a source line that connects with the source region is formed in the first inter-layer insulating layer. After that, a second inter-layer insulating layer is formed over the first inter-layer insulating layer. The second inter-layer insulating layer and the first inter-layer insulating layer are patterned to form a plurality of first contact openings and a plurality of second contact openings. The first contact openings expose the source line and the second contact openings expose the second gates of the second memory units. Thereafter, a plurality of first conductive plugs is formed inside the first contact openings and a plurality of second conductive plugs is formed inside the second contact openings. A first conductive line and a plurality of second conductive lines are formed over the second inter-layer insulating layer. The first conductive line connects with the first conductive plug and the second conductive lines connect with the second conductive plugs in the same column. Then, a third inter-layer insulating layer is formed over the substrate. After that, a third conductive plug having contact with the drain region is formed in the third inter-layer insulating layer, the second inter-layer insulating layer and the first inter-layer insulating layer. Lastly, a bit line having contact with the third conductive plug is formed over the third inter-layer insulating layer.

According to the method of fabricating a non-volatile memory in the preferred embodiment of the present invention, the first conductive plug and the second conductive plug are fabricated using tungsten and the first conductive line and the second conductive line are fabricated using copper-aluminum alloy, for example.

According to the method of fabricating a non-volatile memory in the preferred embodiment of the present invention, the first composite layer and the second composite layer are oxide/nitride/oxide composite layers.

In the aforementioned method of fabricating a non-volatile memory, a second conductive plug is formed at a distance of several second memory units away. The second conductive plug can be fabricated together with the first conductive plug for connecting with the source line. Hence, the processing step is simplified and the gate conductivity of the second memory units is increased so that the electrical performance of the second memory units is improved. As a result, the difference in electrical properties between the second memory units and the first memory units is minimized and hence the efficiency and stability of the device is raised.

The present invention also provides a non-volatile memory structure. The non-volatile memory includes a substrate, a plurality of first memory units, a plurality of second memory units, a plurality of insulating spacers, a source region, a drain region, a first inter-layer insulating layer, a source line, a metallic line, a second inter-layer insulating layer and a bit line. The first memory units are disposed on the substrate and the first memory units are separated from one another by a gap. Each first memory unit includes a composite layer, a first gate and a cap layer sequentially formed over the substrate. The second memory units are disposed in the gaps between the first memory units. The second memory units together with the first memory units form a memory cell column. Each second memory unit includes a second composite layer and a second gate sequentially formed over the substrate. The insulating spacers are disposed between the first memory units and the second memory units. The source region and the drain region are disposed in the substrate on the respective sides of the memory cell column. The first inter-layer insulating layer is disposed on the substrate and the source line is disposed within the first inter-layer insulating layer for connecting with the source region. The metallic lines are disposed in the first inter-layer insulating layer and aligned in a direction perpendicular to the memory cell column. Each metallic line is connected to the second gate of a corresponding second memory unit. The second inter-layer insulating layer is disposed on the first inter-layer insulating layer. The bit line is disposed on the second inter-layer insulating layer and electrically connected to the drain region through a conductive plug.

According to the non-volatile memory in the preferred embodiment of the present invention, the first gate is fabricated using a polycide material, the second gate is fabricated using doped polysilicon and the source line and metallic line are fabricated using tungsten, for example.

The present invention also provides an alternative non-volatile memory structure. The non-volatile memory includes a substrate, a plurality of first memory units, a plurality of second memory units, a plurality of insulating spacers, a source region, a drain region, a first inter-layer insulating layer, a source line, a second inter-layer insulating layer, a third inter-layer insulating layer, a first conductive line, a plurality of second conductive lines and a bit line. The first memory units are disposed on the substrate and the first memory units are separated from one another by a gap. Each first memory unit includes a first composite layer, a first gate and a cap layer sequentially formed over the substrate. The second memory units are disposed in the gaps between the first memory units. The second memory units together with the first memory unit form a memory cell column. Each second memory unit includes a second composite layer and a second gate. The insulating spacers are disposed between the first memory units and the second memory units. The source region and the drain region are disposed in the substrate on the respective sides of the memory cell column. The first inter-layer insulating layer is disposed on the substrate. The source line is disposed in the first inter-layer insulating layer for connecting with the source region. The second inter-layer insulating layer is disposed on the first inter-layer insulating layer and the third inter-layer insulating layer is disposed on the second inter-layer insulating layer. The first conductive line is disposed in the third inter-layer insulating layer and electrically connected the source line through a first conductive plug in the second inter-layer insulating layer. The second conductive lines are disposed in the third inter-layer insulating layer. The second conductive lines are connected to various second gates through a plurality of second conductive plugs in the first inter-layer insulating layer and the second inter-layer insulating layer. The bit line is disposed on the third inter-layer insulating layer and electrically connected to the drain region through a third conductive plug.

According to the non-volatile memory in the preferred embodiment of the present invention, the first conductive plug and the second conductive plug are fabricated using tungsten, for example. The first conductive line and the second conductive line are fabricated using copper-aluminum alloy, for example. The first composite layer and the second composite layer are oxide/nitride/oxide composite layers, for example.

The non-volatile memory in the present invention uses conductive lines to connect with the second gates. Since the conductive lines are fabricated using a metallic or alloy material, the electrical resistance of the second gates? is reduced and the electrical properties of the second memory units are improved. Consequently, the difference in electrical performance between the first memory units and the second memory units is minimized. Ultimately, the efficiency and stability of the device is raised.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
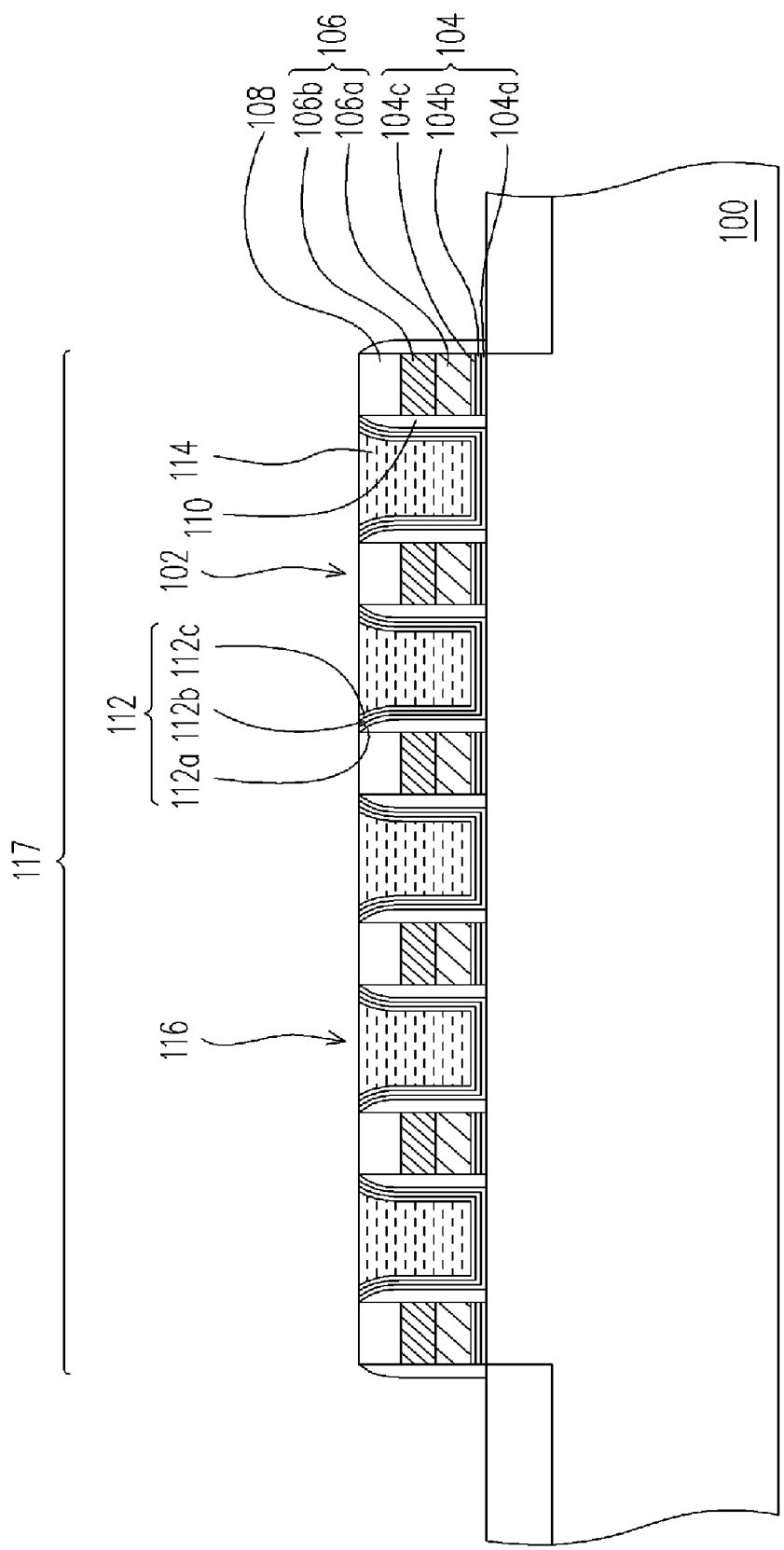
FIG. 1 is a schematic cross-sectional view of a conventional non-volatile memory.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the steps for fabricating a non-volatile memory according to one preferred embodiment of the present invention.

Figure 2A:
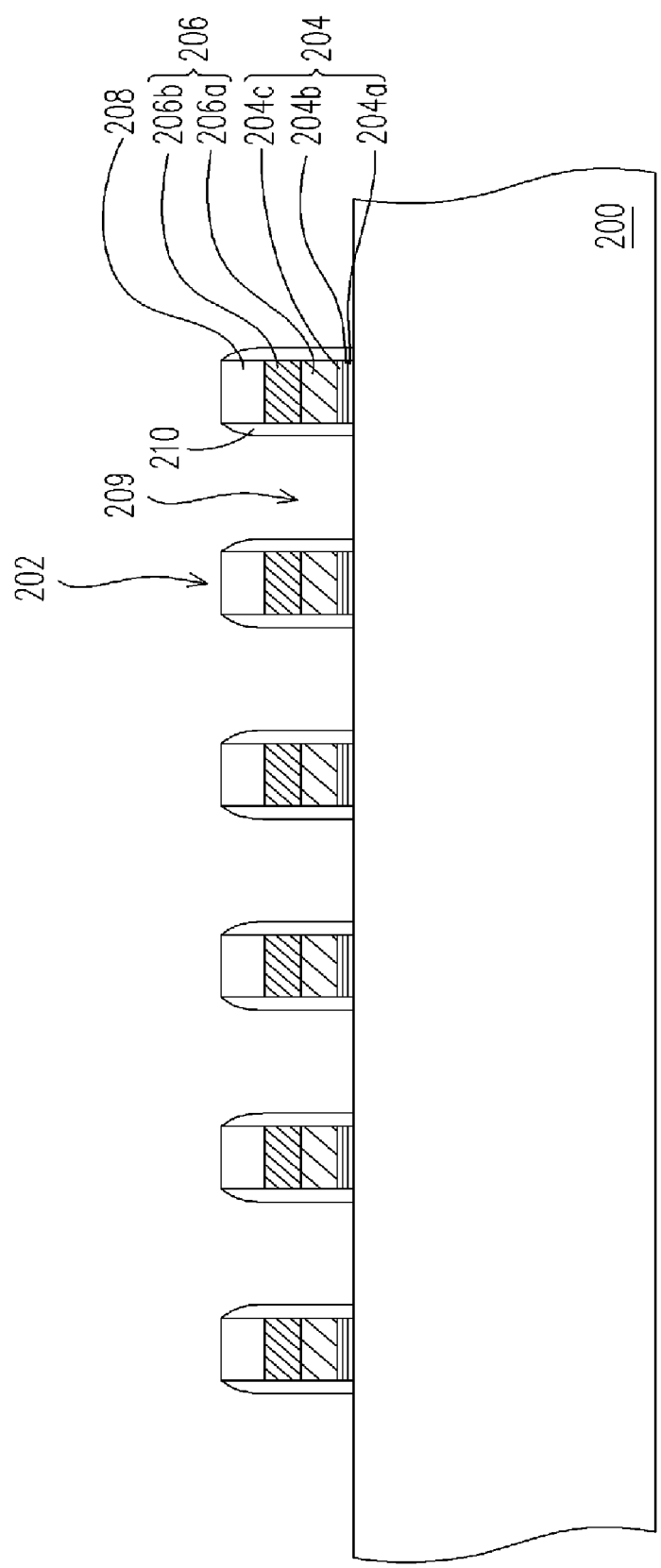
FIGS. 2A through 2E are schematic cross-sectional views showing the steps for fabricating a non-volatile memory according to one preferred embodiment of the present invention.

As shown in FIG. 2A, a substrate 200 is provided. Then, a plurality of memory units 202 is formed on the substrate 200. The memory units 202 are separated from one another by a gap 209. Each memory unit 202 includes a composite layer 204, a gate 206 and a cap layer 208 sequentially formed over the substrate 200. The memory units 202 are formed, for example, by depositing composite dielectric material, conductive material and insulating material over the substrate and patterning the aforementioned material layers by performing photolithographic and etching processes.

The composite layer 204 includes a bottom dielectric layer 204a, a charge-trapping layer 204b and a top dielectric layer 204c, for example. The bottom dielectric layer 204a is a silicon oxide layer formed, for example, by performing a thermal oxidation process. The charge-trapping layer 204b is a silicon nitride layer formed, for example, by performing a chemical vapor deposition process. The top dielectric layer 204c is a silicon oxide layer formed, for example, by performing a chemical vapor deposition process. Obviously, the bottom dielectric layer 204a and the top dielectric layer 204c can be fabricated using other material having similar properties. The material constituting the charge-trapping layer 204b is also not limited to silicon nitride. Other types of material capable of trapping electrons including, for example, tantalum oxide, strontium titanate and hafnium oxide, can also be used.

The gates 206 are fabricated using polycide material, for example. The method of forming the polycide layer includes forming a doped polysilicon layer 206a over the substrate 200 and then forming a silicide layer 206b over the doped polysilicon layer 206a. The silicide layer 206b is formed, for example, by performing a self-aligned silicide process or directly depositing silicide material in a chemical vapor deposition process. The cap layer 208 is a silicon oxide layer formed, for example, by performing a chemical vapor deposition process.

Then, a plurality of insulating spacers 210 is formed on the sidewalls of the memory units 202. The insulating spacers 210 are silicon nitride layers formed, for example, by performing an anisotropic etching operation so that only the insulating material layers next to the sidewalls of the memory units 202 are retained.

Figure 2B:
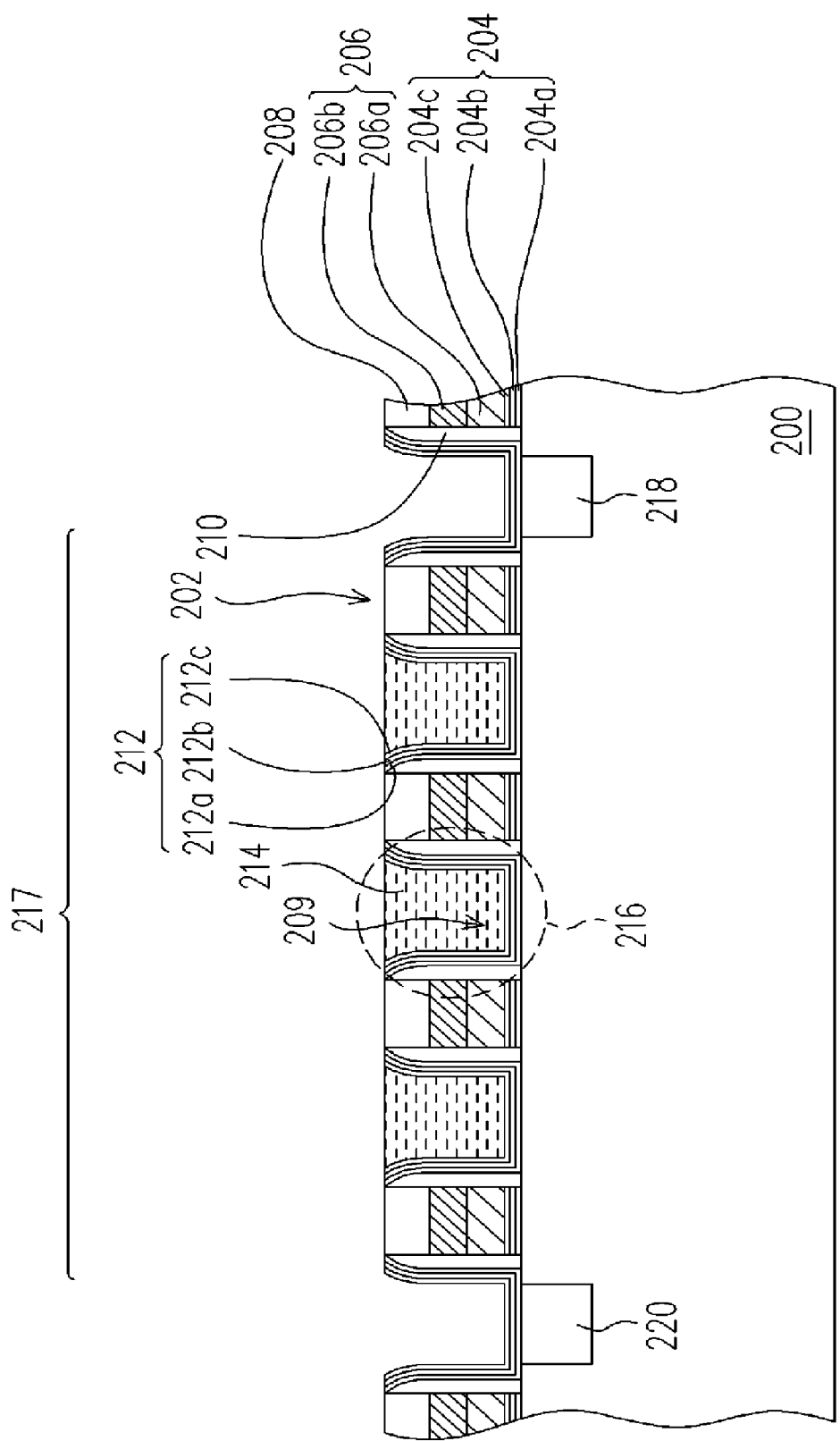

As shown in FIG. 2B, a plurality of memory units 216 is formed in the gaps 209 between the memory units 202. Each memory unit 216 includes a composite layer 212 and a gate 214 sequentially formed over the substrate 200, for example. The composite layer 212 includes a bottom dielectric layer 212a, a charge-trapping layer 212b and a top dielectric layer 212c, for example. The bottom dielectric layer 212a is a silicon oxide layer formed, for example, by performing a thermal oxidation process. The charge-trapping layer 212b is a silicon nitride layer formed, for example, by performing a chemical vapor deposition process. The top dielectric layer 212c is a silicon oxide layer formed, for example, by performing a chemical vapor deposition process. Obviously, the bottom dielectric layer 212a and the top dielectric layer 212c can be fabricated using other material having similar properties. Moreover, the material constituting the charge-trapping layer 212b is also not limited to silicon nitride. Other types of material capable of trapping electrons including, for example, tantalum oxide, strontium titanate and hafnium oxide, can also be used.

The gate 214 completely fills the gap 209 between two adjacent memory units 202. The gate 214 is a doped polysilicon layer formed, for example, by depositing undoped polysilicon material over the substrate and performing an ion implant process to dope the undoped polysilicon layer thereafter. The memory units 216 together with the memory units 202 form a memory cell array 217.

After that, a source region 218 and a drain region 220 are formed in the substrate 200 on the respective sides of the memory cell array 217. The method of forming the source region 218 and the drain region 220 includes removing any residual gate 214 material on the area designated for forming the source region and the drain region and performing an ion implant process. In the ion implant process, either P-type ions or N-type ions are implanted depending upon the desired state of the device.

Figure 2C:
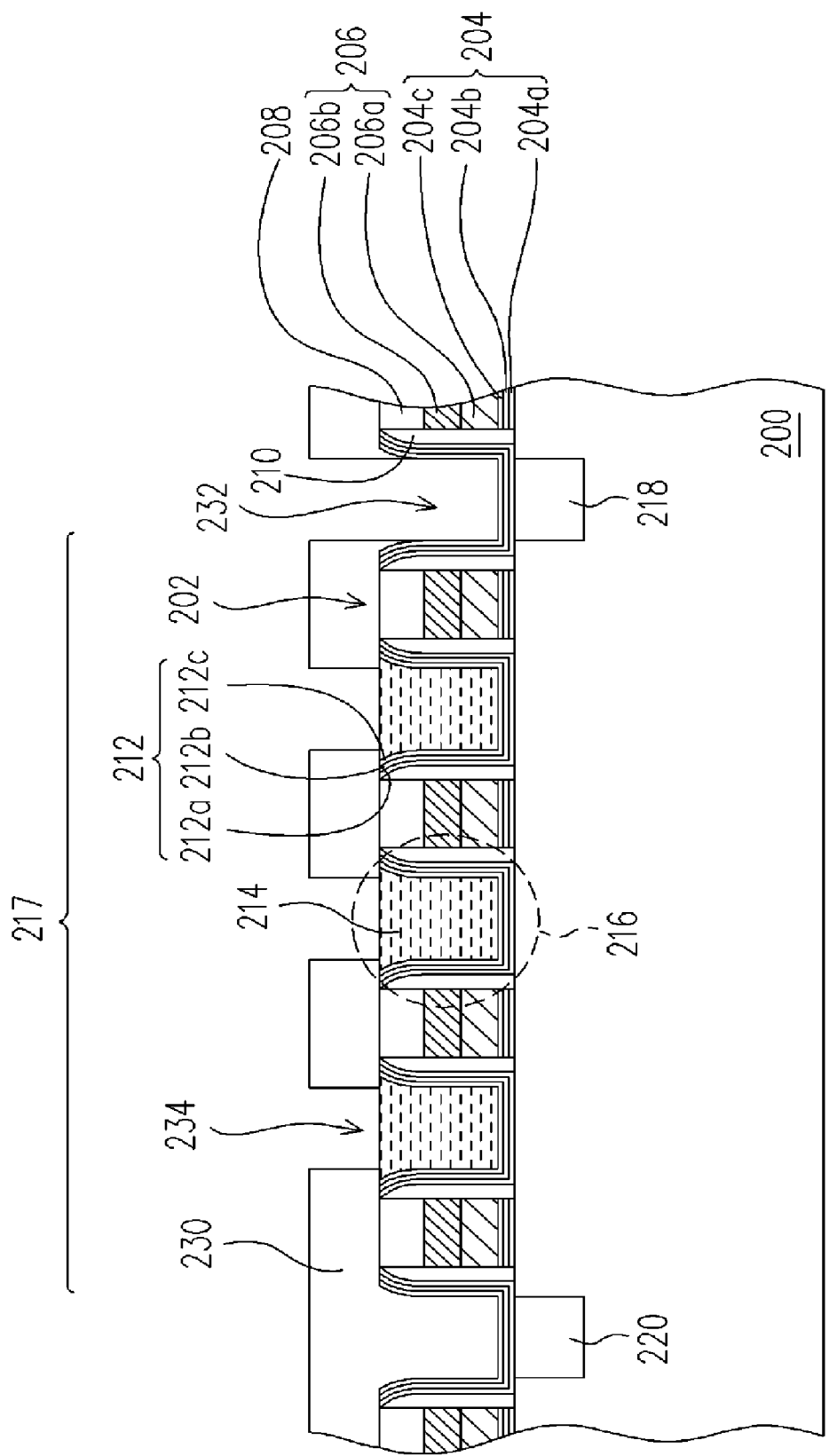

As shown in FIG. 2C, an inter-layer insulating layer 230 is formed over the substrate 200. The inter-layer insulating layer 230 is patterned to form a trench 232 and a plurality of trenches 234. The trench 232 exposes the source region 218 while the trenches 234 expose the gate 214 of the memory units 216 in the same column. The inter-layer insulating layer 230 is a silicon oxide layer or other insulating material layer formed, for example, by performing a chemical vapor deposition process. The method of patterning the inter-layer insulating layer 230 includes performing a photolithographic process and then performing an anisotropic etching operation to form the trenches 232 and 234.

Figure 2D:
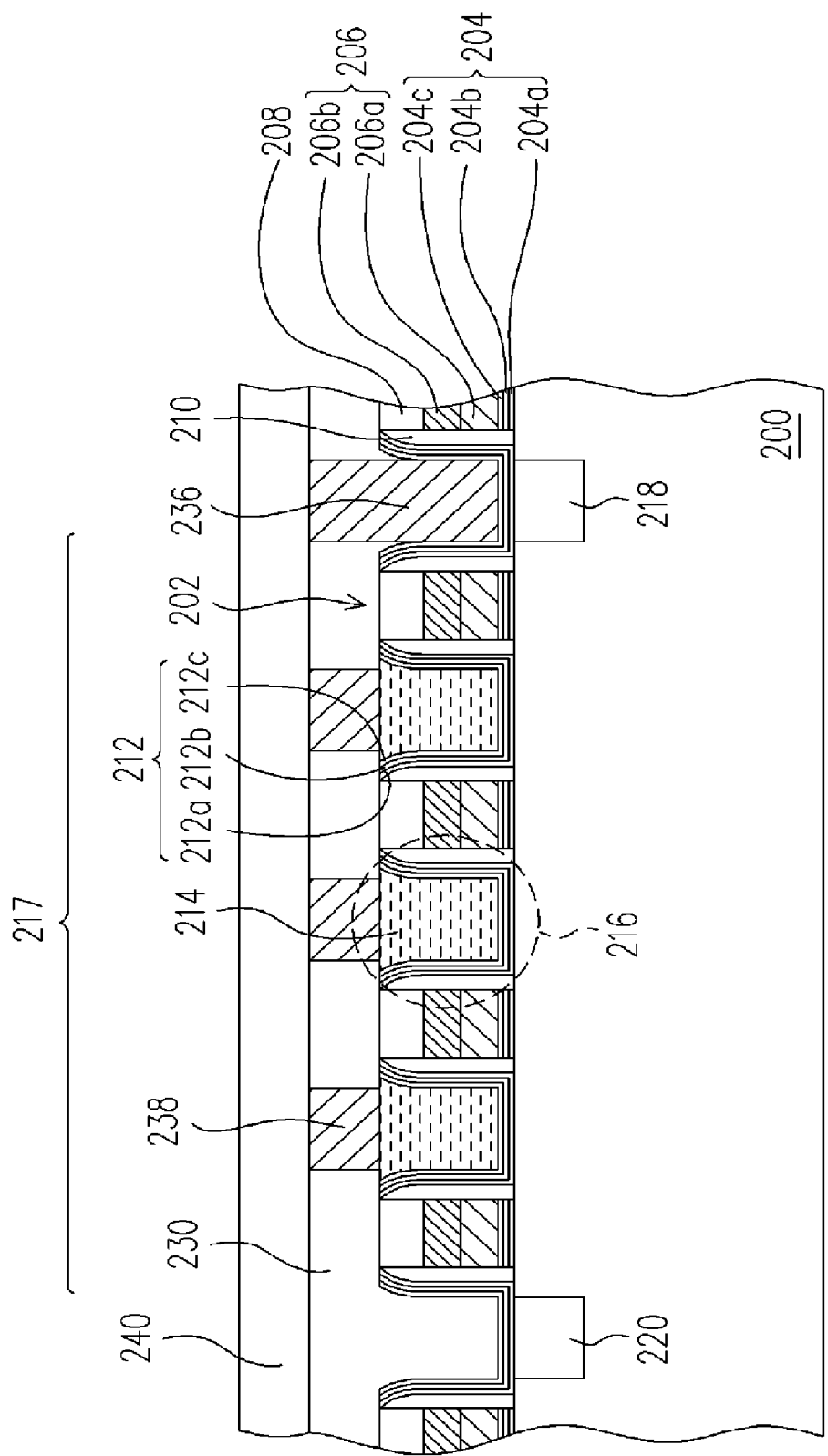

As shown in FIG. 2D, a conductive layer (not shown) is formed over the substrate 200. The conductive layer completely fills the trenches 232 and 234. Then, a portion of the conductive layer is removed until the inter-layer insulating layer 230 is exposed so that a source line 236 is formed in the trench 232 and a plurality of conductive lines 238 is formed in the respective trenches 234. The conductive layer is fabricated using tungsten and formed by performing a chemical vapor deposition process. The method of removing a portion of the conductive layer includes performing a chemical-mechanical polishing operation, for example. After that, another inter-layer insulating layer 240 is formed over the substrate 200.

Figure 2E:
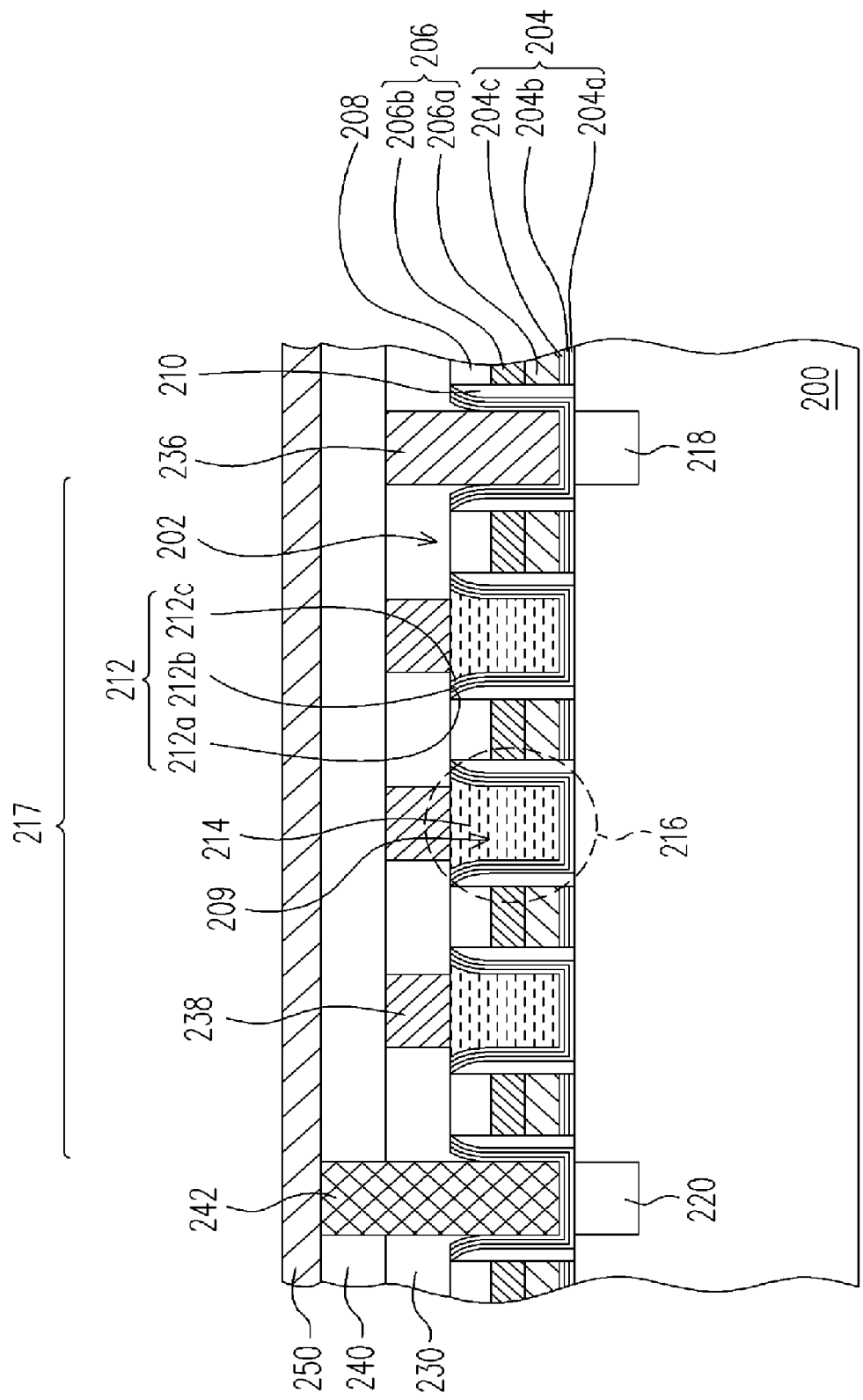

As shown in FIG. 2E, a conductive plug 242 in contact with the drain region 220 is formed in the inter-layer insulating layer 240 and the inter-layer insulating layer 230. The method of forming the conductive plug 242 includes, for example, forming a contact opening (not shown) in the inter-layer insulating layer 240 and the inter-layer insulating layer 230 to expose the drain region 220. Then, a conductive material such as tungsten or copper is deposited into the contact opening. Any redundant conductive material is removed until the inter-layer insulating layer 240 is exposed to form the conductive plug 242. The method of removing the redundant conductive material includes, for example, performing a back etching operation or a chemical-mechanical polishing operation. Thereafter, a bit line 250 in contact with the conductive plug 242 is formed over the inter-layer insulating layer 240.

In the aforementioned method of fabricating the non-volatile memory, the process of patterning the first inter-layer insulating layer 230 may include the fabrication of the trenches 232 and 234. The source line 236 and the plurality of conductive lines 238 for connecting with the gates 214 can also be fabricated in the same step. Thus, without increasing the number of processing steps, the electrical resistance of the gates 214 of the memory unit 216 is reduced due to the formation of the conductive lines 238. Hence, there is an increase in the conductivity of the device.

In the following, the non-volatile memory structure fabricated according to the present invention is described in detail. FIG. 2E is a schematic cross-sectional view showing the structure of a non-volatile memory according to the present invention.

As shown in FIG. 2E, the memory includes a substrate 200, a plurality of memory units 202, a plurality of memory units 216, a plurality of insulating spacers 210, a source region 218, a drain region 220, an inter-layer insulating layer 230, a source line 236, a conductive line (a metallic line) 238, an inter-layer insulating layer 240 and a bit line 250.

The memory units 202 are disposed on the substrate 200. The memory units 202 are separated from one another through a gap 209. Each memory unit 202 includes a composite layer 204, a gate 206 and a cap layer 208 sequentially formed over the substrate 200. The composite layer 204 further includes a bottom dielectric layer 204a, a charge-trapping layer 204b and a top dielectric layer 204c, for example. The bottom dielectric layer 204a, the charge-trapping layer 204b and the top dielectric layer 204c are silicon oxide layer, silicon nitride layer and silicon oxide layer respectively, for example. The gate 206 is fabricated using polycide material, for example. The gate 206 includes a doped polysilicon layer 206a and a silicide layer 206b, for example. The cap layer 208 is fabricated using silicon oxide, for example.

The memory units 216 are disposed in the gaps 209 between the memory units 202. Each memory unit 216 includes a composite layer 212 and a gate 214 sequentially formed over the substrate 200. The composite layer 212 includes a bottom dielectric layer 212a, a charge-trapping layer 212b and a top dielectric layer 212c, for example. The bottom dielectric layer 212a, the charge-trapping layer 212b and the top dielectric layer 212c are silicon oxide layer, silicon nitride layer and silicon oxide layer respectively, for example. The gate 214 is fabricated using doped polysilicon, for example. The insulating spacers 210 are disposed between the memory units 202 and the memory units 216. The insulating spacers 210 are fabricated using silicon oxide or silicon nitride or a suitable insulating material, for example. The memory units 216 together with the memory units 202 form a memory cell array 217.

The source region 218 and the drain region 220 are disposed in the substrate 200 on the respective sides of the memory cell array 217. The inter-layer insulating layer 230 is disposed on the substrate 200. The source line 236 is disposed in the inter-layer insulating layer 230 and connected to the source region 218. The conductive lines (metallic lines) 238 are disposed in the inter-layer insulating layer 230 and connected with the gate 214 of the memory units 216 in the same column so that the electrical resistance of the gates 214 is reduced. The source line 236 and the conductive lines (the metallic lines) 238 are fabricated using a conductive material such as tungsten or aluminum, for example. The inter-layer insulating layer 240 is disposed over the inter-layer insulating layer 230. The bit line 250 is disposed on the inter-layer insulating layer 240 and is electrically connected to the drain region 220 through a conductive plug 242. The inter-layer insulating layer 230 and the inter-layer insulating layer 240 are fabricated using silicon oxide, silicon nitride or other suitable insulating material, for example. The conductive plug 242 is fabricated using a conductive material such as tungsten or aluminum, for example.

In the aforementioned embodiment, the setting of the conductive lines 238 over the gates 214 of the memory units 216 can reduce the electric resistance of the gates 214. This prevents the gate 214 from having a higher electrical resistance and problems related to a low electrical conductivity when the gates 214 are fabricated from doped polysilicon material alone. Hence, the difference in electrical performance between the memory units 216 and the memory units 202 (whose gates are fabricated using highly conductive polycide material) is minimized. As a result, the efficiency and stability of the device is improved.

FIGS. 3A through 3D are schematic cross-sectional views showing the steps for fabricating a non-volatile memory according to another preferred embodiment of the present invention. FIG. 3E is a top view of a non-volatile memory according to one preferred embodiment of the present invention.

Figure 3A:
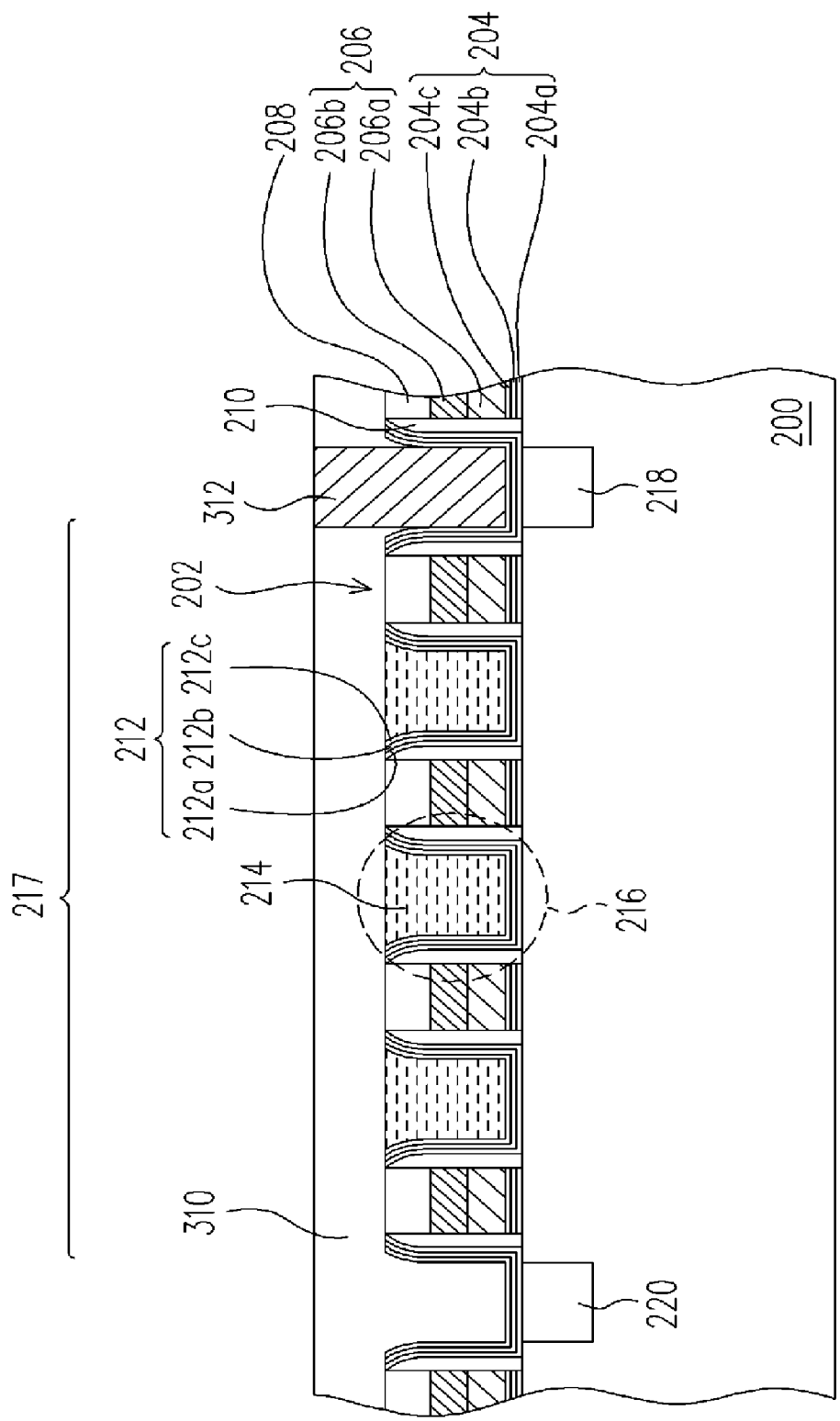
FIGS. 3A through 3D are schematic cross-sectional views showing the steps for fabricating a non-volatile memory according to another preferred embodiment of the present invention.

FIG. 3A is a continuation from FIG. 2B after the memory cell array 217 has already been formed over the substrate 200 and the source region 218 and the drain region 220 have already been formed in the substrate 200 on the respective sides of the memory cell array 217. As shown in FIG. 3A, an inter-layer insulating layer 310 is formed over the substrate 200. Then, a source line 312 for connecting with the source region 218 is formed in the inter-layer insulating layer 310. The inter-layer insulating layer 310 is fabricated using an insulating material such as silicon oxide or silicon nitride, for example. The method of forming the inter-layer insulating layer 310 includes, for example, performing a chemical vapor deposition process. The source line 312 is formed, for example, by performing photolithographic and etching processes and then depositing conductive material such as tungsten or copper to form the source line 312 that connects with the source region 218.

Figure 3B:
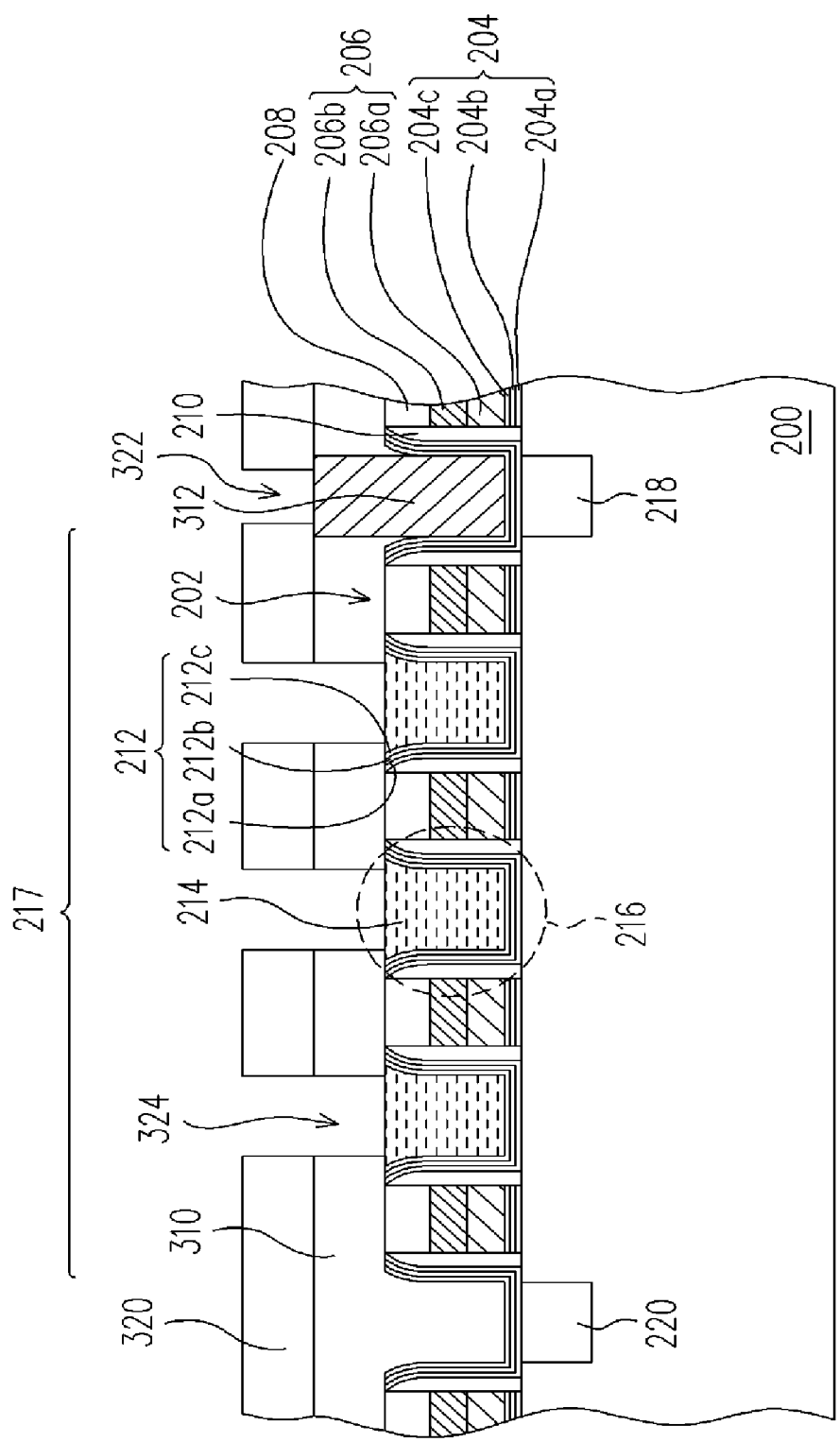

As shown in FIG. 3B, another inter-layer insulating layer 320 is formed over the inter-layer insulating layer 310. Next, the inter-layer insulating layer 320 and the inter-layer insulating layer 320 are patterned to form a plurality of contact openings 322 and a plurality of contact openings 324. The method of patterning the inter-layer insulating layer 320 and the inter-layer insulating layer 310 includes performing a photolithographic process and then an anisotropic etching operation. The contact openings 322 expose the source line 312 while the contact openings 324 expose the gate 214 of the memory units 216.

Figure 3C:
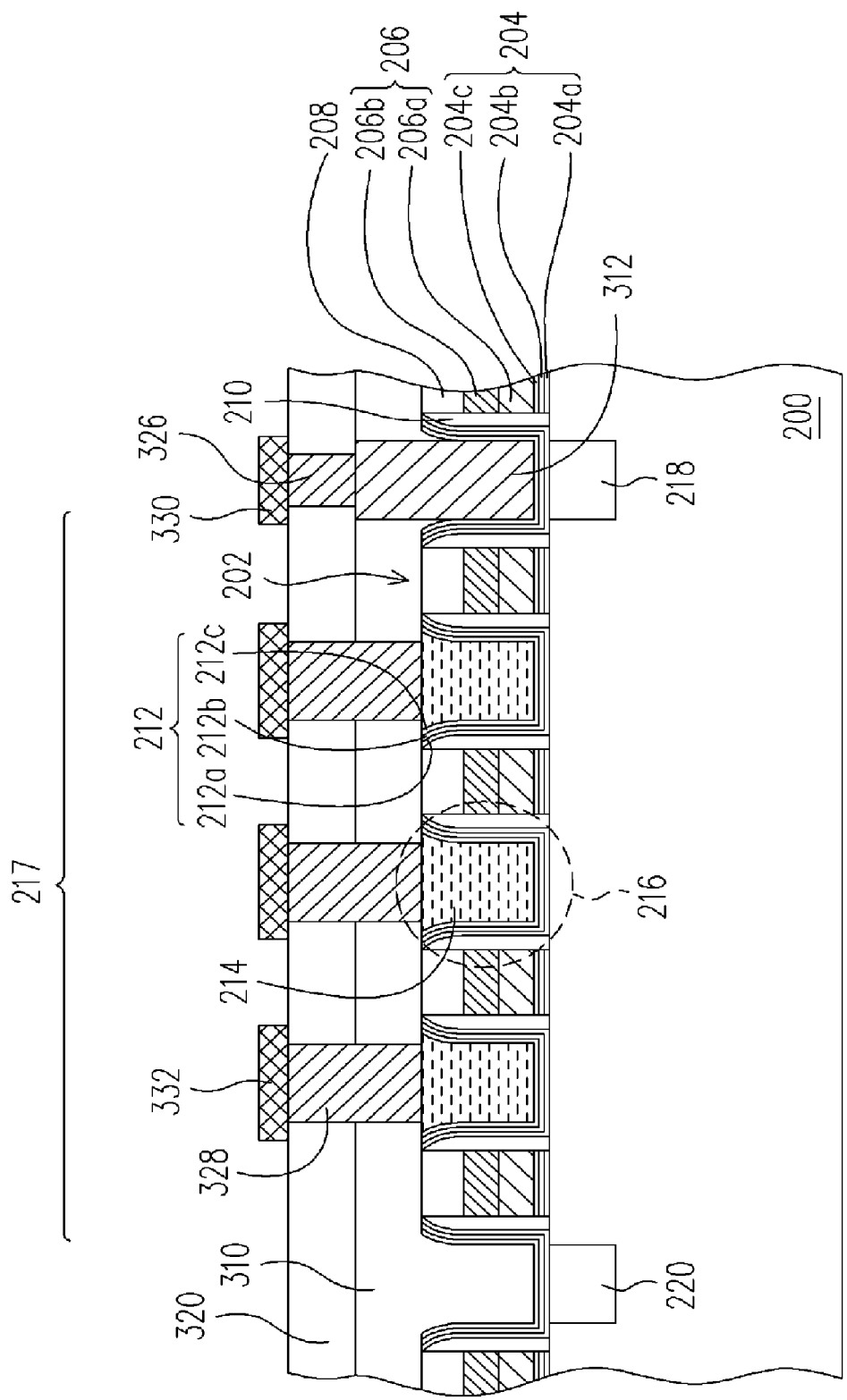

As shown in FIG. 3C, a plurality of conductive plugs 326 is formed in the respective contact openings 322 and a plurality of conductive plugs 328 is formed in the respective contact openings 324. The conductive plugs 326 and 328 are fabricated using a conductive material such as tungsten or aluminum, for example. The method of forming the conductive plugs 326 and 328 includes performing a chemical vapor deposition process to deposit a layer of conductive material and then performing an etching back operation or a chemical-mechanical polishing operation to remove any redundant conductive material layer.

Then, a conductive line 330 and a plurality of conductive lines 332 are formed on the inter-layer insulating layer 320. The conductive line 330 connects with the conductive plug 326 while the conductive lines 332 connect with corresponding conductive plugs 328 in the same column such that the conductive plugs 328 in the same column are separated from one another by several memory units 216 (as shown in FIG. 3E). The conductive lines 330 and 332 are fabricated using a conductive material such as copper-aluminum alloy. Since the method of forming the conductive lines 330 and 332 should be familiar to those skilled in this field, detailed description is omitted.

Figure 3D:
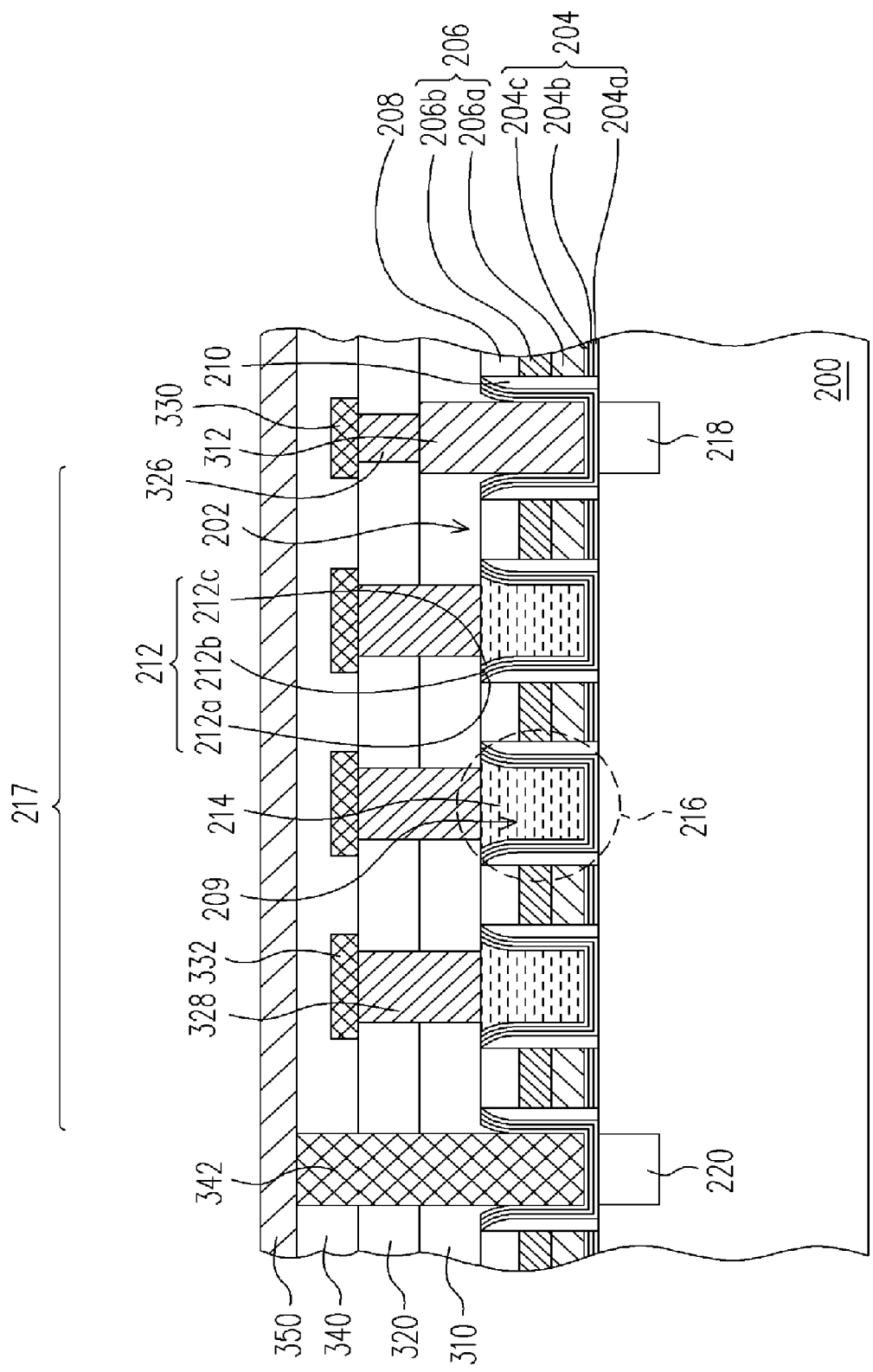
Figure 3E:
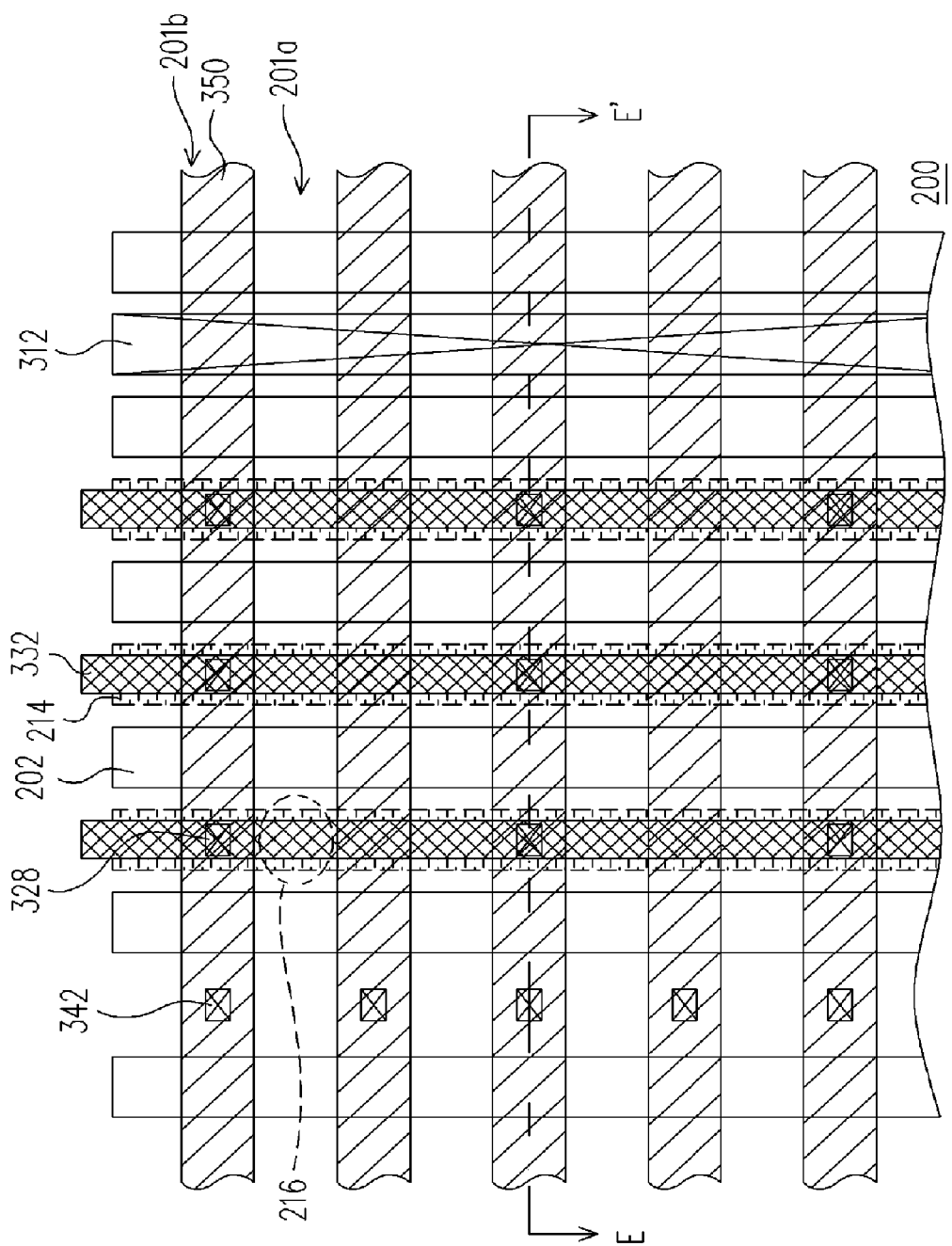
FIG. 3E is a top view of a non-volatile memory according to one preferred embodiment of the present invention.

As shown in FIG. 3D, another inter-layer insulating layer 340 is formed over the substrate 200. A conductive plug 342 in contact with the drain region 220 is formed in the inter-layer insulating layer 340, the inter-layer insulating layer 320 and the inter-layer insulating layer 310. After that, a bit line 350 in contact with the conductive plug 342 is formed on the inter-layer insulating layer 340. FIG. 3E is a top view of a non-volatile memory according to one preferred embodiment of the present invention. The device isolation structure 201a is set up in the substrate for defining an active region 201b.

In the aforementioned method of fabricating the non-volatile memory, the process of fabricating the conductive plug 328 and the process of fabricating the conductive plug 326 that connects with the source line 312 can be integrated together to simplify their productions. Furthermore, using the conductive line 332 to connect with the conductive plug 328 is capable of increasing the conductivity of the gate 214 so that the electrical performance of the memory units 216 is improved.

In the following, the non-volatile memory structure fabricated according to the present invention as shown in FIG. 3D, where FIG. 3D is a structural cross-section along line E-E' in FIG. 3E, is described.

The non-volatile memory includes a substrate 200, a plurality of memory units 202, a plurality of memory units 216, a plurality of insulating spacers 210, a source region 218, a drain region 220, an inter-layer insulating layer 310, a source line 312, an inter-layer insulating layer 320, a conductive plug 328, a conductive plug 326, a conductive line (metallic line) 332, a conductive line 330, an inter-layer insulating layer 340, a conductive plug 342 and a bit line 350.

The memory units 202 are disposed on the substrate 200. The memory units 202 are separated from one another through a gap 209. Each memory unit 202 includes a composite layer 204, a gate 206 and a cap layer 208 sequentially formed over the substrate 200. The composite layer 204 further includes a silicon oxide layer, a silicon nitride layer and another silicon oxide layer, for example. The gate 206 is fabricated using polycide material, for example. The gate 206 includes a doped polysilicon layer 206a and a silicide layer 206b, for example. The cap layer 208 is fabricated using silicon oxide, for example.

The memory units 216 are disposed in the gaps 209 between the memory units 202. Each memory units 216 includes a composite layer 212 and a gate 214 sequentially formed over the substrate 200. The composite layer 212 includes a silicon oxide layer, a silicon nitride layer and another silicon oxide layer, for example. The gate 214 is fabricated using doped polysilicon, for example. The insulating spacers 210 are disposed between the memory units 202 and the memory units 216. The insulating spacers 210 are fabricated using silicon oxide, silicon nitride or a suitable insulating material, for example. The memory units 216 together with the memory units 202 form a memory cell array 217.

The source region 218 and the drain region 220 are disposed in the substrate 200 on the respective sides of the memory cell array 217. The inter-layer insulating layer 310 is disposed on the substrate 200. The inter-layer insulating layer 310 is fabricated using an insulating material such as silicon oxide or silicon nitride, for example. The source line 312 is disposed in the inter-layer insulating layer 310 and connected to the source region 218. The inter-layer insulating layer 320 is disposed on the inter-layer insulating layer 310. The conductive plug 326 is disposed in the inter-layer insulating layer 320 for connecting with the source line 312. The conductive plugs 328 are disposed in the inter-layer insulating layer 320 and the inter-layer insulating layer 310 for connecting with the gate 214 of the memory units 216. As shown in FIG. 3E, the conductive plugs 328 in the same column are separated from one another by a few memory units 216 such as four memory units 216. Obviously, the number of memory units 216 between two adjacent conductive plugs 328 can be eight or sixteen according to the actual design of the device. The conductive plugs 326 and 328 are fabricated using a conductive material such as tungsten or aluminum, for example.

The inter-layer insulating layer 340 is disposed on the inter-layer insulating layer 320. The conductive lines (metallic lines) 332 and 330 are disposed within the inter-layer insulating layer 340. The conductive lines (the metallic lines) 332 connect with the gate 214 of the memory unit 216 in the same column through the conductive plugs 328; and the conductive line 330 connects with the source lines 312 through the conductive plug 326. The conductive lines (the metallic lines) 332 and the conductive line 330 are fabricated using a conductive material such as copper-aluminum alloy, for example.

In the aforementioned embodiment, the conductive plugs 328 are formed on the gate 214 of the memory units 216 and the conductive plugs 328 in the same column are connected through the conductive line 332. This prevents the gate 214 from having a higher electrical resistance and problems related to a low electrical conductivity when the gates 214 are fabricated from doped polysilicon material alone. Hence, the difference in electrical performance between the memory units 216 and the memory units 202 (whose gates are fabricated using highly conductive polycide material) is minimized. As a result, the efficiency and stability of the device is improved.

The non-volatile memory structure (as shown in FIG. 3D) in the present embodiment differs from the structure in the previous embodiment (as shown in FIG. 2E). In this embodiment, a conductive plug 328 is formed between the conductive line 332 and the gate 214. Furthermore, the conductive line 332 connects with the gate 214 of the memory units 116 in the same column. With this arrangement, the resistance at the gate 214 is reduced so that the conductivity of the memory units 216 is increased.

In summary, the process of forming conductive lines 238 on the gates 214 or connecting the gates 214 of the memory units 216 in the same column to the conductive plug 328 through a conductive line 332 can be integrated with the processes in the source region to simplify the manufacturing steps. Furthermore, both non-volatile memory structures in the present invention can reduce the electrical resistance of the gates 214 and minimize gate conductivity problems. Hence, the difference in electrical performance between the memory units 216 and the memory units 202 (whose gates are fabricated using highly conductive polycide material) is minimized. As a result, the efficiency and stability of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a substrate;
   a plurality of first memory units disposed on the substrate, wherein the first memory units are separated from one another by a gap and each first memory unit comprises a first composite layer, a first gate and a cap layer sequentially formed over the substrate;
   a plurality of second memory units disposed in the gaps between the first memory units, wherein each second memory unit comprises a second composite layer and a second gate sequentially formed over the substrate and the second memory units together with the first memory units form a memory cell column;
   a plurality of insulating spacers disposed between the first memory units and the second memory units;
   a source region and a drain region disposed in the substrate on the respective sides of the memory cell column;
   a first inter-layer insulating layer disposed on the substrate;
   a source line disposed in the first inter-layer insulating layer for connecting with the source region;
   a plurality of metallic lines disposed in the first inter-layer insulating layer aligned in a direction perpendicular to the memory cell column for connecting with the second gate of the second memory cell units;
   a second inter-layer insulating layer disposed on the first inter-layer insulating layer; and
   a bit line disposed on the second inter-layer insulating layer for connecting electrically with the drain region through a conductive plug.

2. The non-volatile memory of claim 1, wherein the material constituting the first gate comprises polycide.

3. The non-volatile memory of claim 1, wherein the material constituting the second gate comprises doped polysilicon.

4. The non-volatile memory of claim 1, wherein the material constituting the source line and the metallic lines comprises tungsten.

5. A non-volatile memory, comprising:
   a substrate;
   a plurality of first memory units disposed on the substrate, wherein the first memory units are separated from one another by a gap and each first memory unit comprises a first composite layer, a first gate and a cap layer sequentially formed over the substrate;
   a plurality of second memory units disposed in the gaps between the first memory units, wherein each second memory unit comprises a second composite layer and a second gate sequentially formed over the substrate and the second memory units together with the first memory units form a memory cell column;
   a plurality of insulating spacers disposed between the first memory units and the second memory units;
   a source region and a drain region disposed in the substrate on the respective sides of the memory cell column;
   a first inter-layer insulating layer disposed on the substrate;
   a source line disposed in the first inter-layer insulating layer for connecting with the source region;
   a second inter-layer insulating layer disposed on the first inter-layer insulating layer;
   a third inter-layer insulating layer disposed on the second inter-layer insulating layer;
   a first conductive line disposed in the third inter-layer insulating layer for connecting with the source line through a first conductive plug in the second inter-layer insulating layer;
   a plurality of second conductive lines disposed in the third inter-layer insulating layer for connecting with the second gates through a plurality of second conductive plugs in the first inter-layer insulating layer and the second inter-layer insulating layer; and
   a bit line disposed on the third inter-layer insulating layer for connecting electrically with the drain region trough a third conductive plug.

6. The non-volatile memory of claim 5, wherein the material constituting the first conductive plug and the second conductive plugs comprises tungsten.

7. The non-volatile memory of claim 5, wherein the material constituting the first conductive line and the second conductive lines comprises copper-aluminum alloy.

8. The non-volatile memory of claim 5, wherein the first composite layer and the second composite layer comprises silicon oxide/silicon nitride/silicon oxide composite layers.

* * * * *